United States Patent [19]

Bazes

[11] Patent Number: 5,365,128
[45] Date of Patent: Nov. 15, 1994

[54] HIGH-RESOLUTION SYNCHRONOUS DELAY LINE

[75] Inventor: Mel Bazes, Haifa, Israel

[73] Assignee: Intel Corporation, Santa Clara, Calif.

[21] Appl. No.: 36,219

[22] Filed: Mar. 24, 1993

Related U.S. Application Data

[63] Continuation of Ser. No. 778,005, Oct. 17, 1991, abandoned.

[51] Int. Cl.$^5$ .................. H03K 5/159; H03K 7/00; H03K 3/01; H03K 17/00
[52] U.S. Cl. .................................. 327/141; 328/72; 327/237; 327/259; 327/277
[58] Field of Search ............... 307/595, 597, 601, 602, 307/603, 605, 606, 272.2; 328/55, 63, 66, 72, 155

[56] References Cited

U.S. PATENT DOCUMENTS

| | | | |
|---|---|---|---|
| 4,496,861 | 1/1985 | Bazes | 307/603 |
| 4,975,605 | 12/1990 | Bazes | 307/606 |
| 4,994,695 | 2/1991 | Bazes | 307/602 |
| 5,036,230 | 7/1991 | Bazes | 307/602 |

OTHER PUBLICATIONS

"A CMOS Synchronous Delay Line", Mel Bazes, *Intel Technology Journal*, Fall 1989.

*Primary Examiner*—Timothy P. Callahan
*Assistant Examiner*—Trong Phan
*Attorney, Agent, or Firm*—Blakely, Sokoloff, Taylor & Zafman

[57] ABSTRACT

A synchronous delay line (SDL) for generating delayed signals synchronized with a clock signal is described. The present SDL includes a phase generator and a plurality of serially coupled voltage controlled delay elements. The phase generator takes the clock signal and generates a first trigger signal and a second trigger signal, which are substantially deskewed with respect to each other. Each of the delay elements receives two trigger inputs and outputs a delayed signal and two trigger outputs. The first and second trigger signals are coupled to one of the delay elements as trigger inputs. Each transition of the first and second trigger signals triggers the propagation of two waves through the delay line. The present SDL has a minimum tap-to-tap delay of only one inverter delay, versus a minimum tap-to-tap delay of two NAND gates in prior SDLs. Thus, the present SDL provides for double the number of output taps, and hence, double the resolution as compared to prior SDLs.

28 Claims, 9 Drawing Sheets

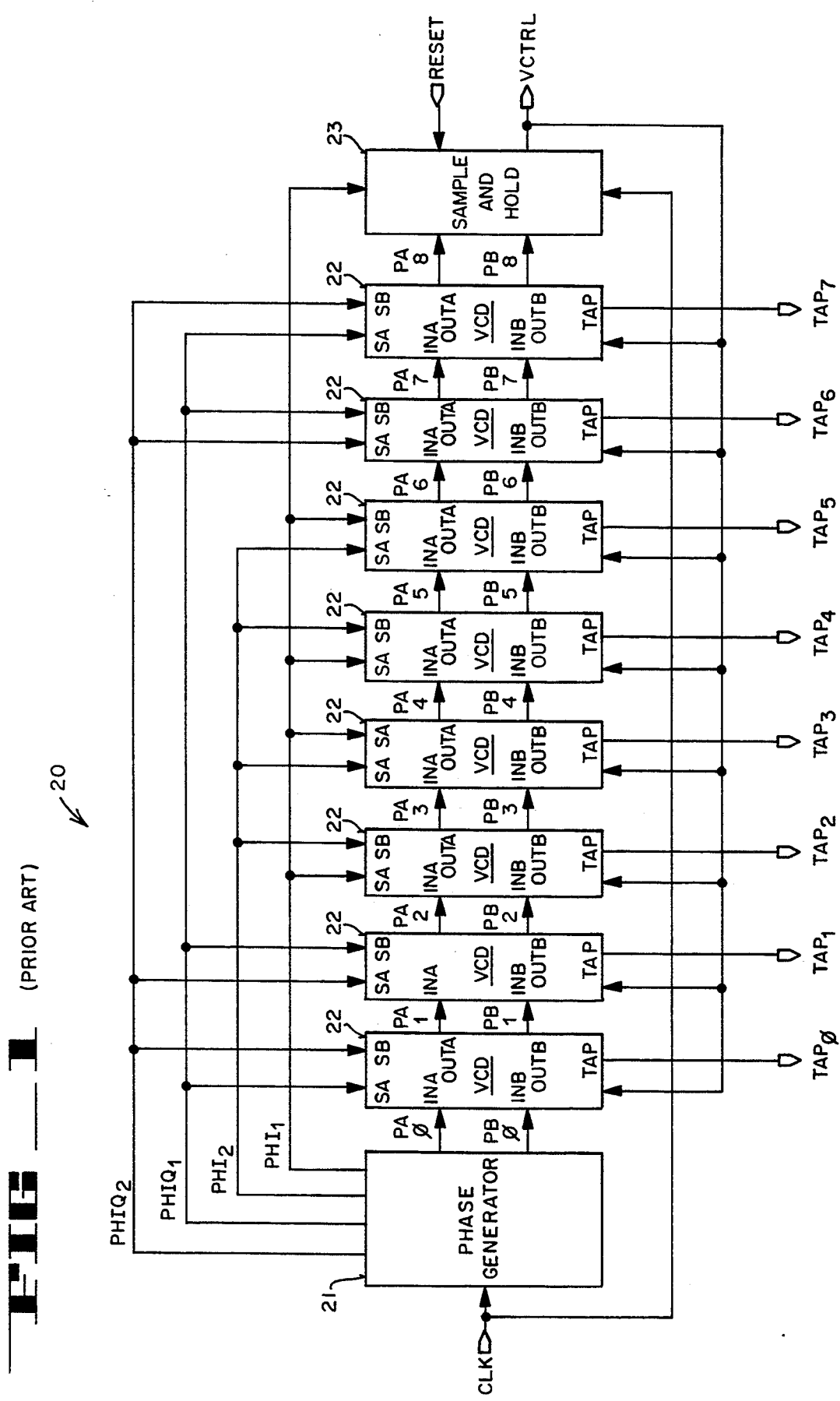
FIG_1 (PRIOR ART)

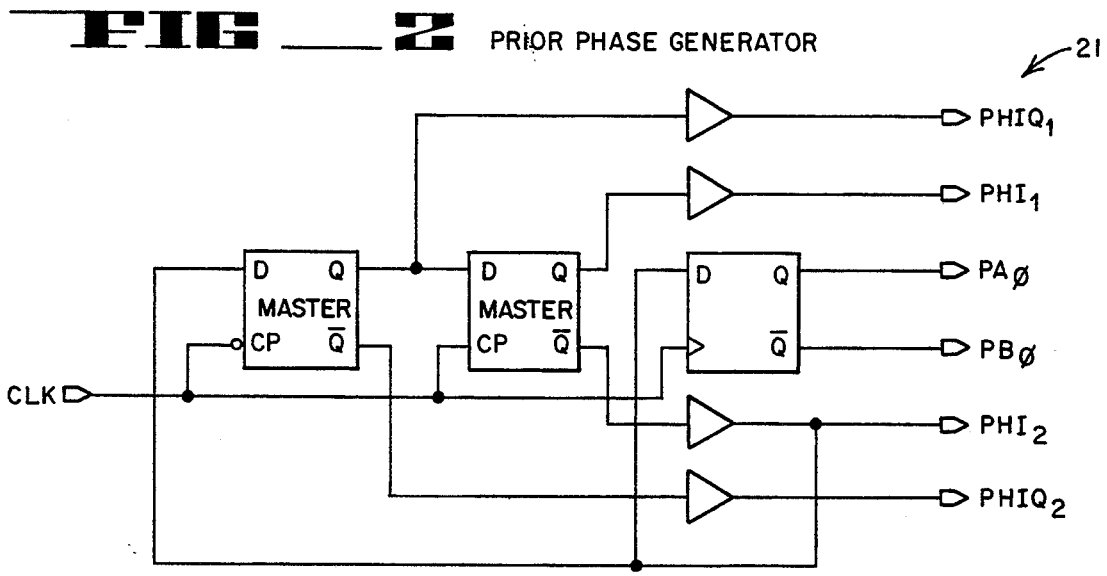
FIG_2 PRIOR PHASE GENERATOR
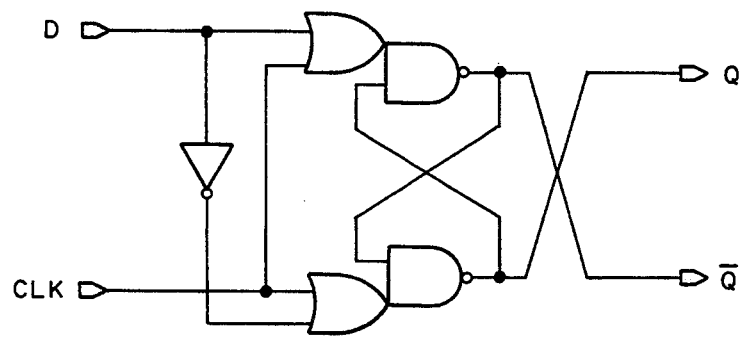
FIG_3A (PRIOR ART)
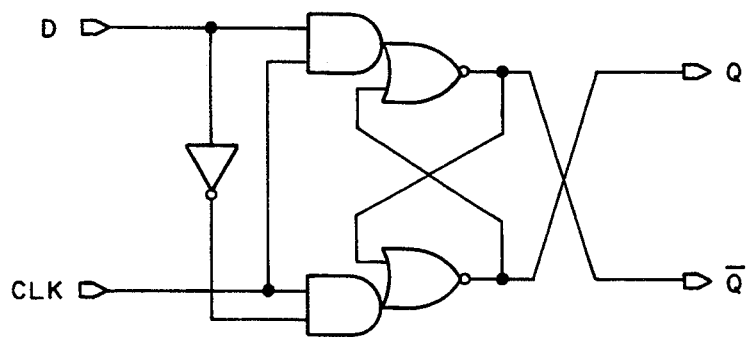
FIG_3B (PRIOR ART)

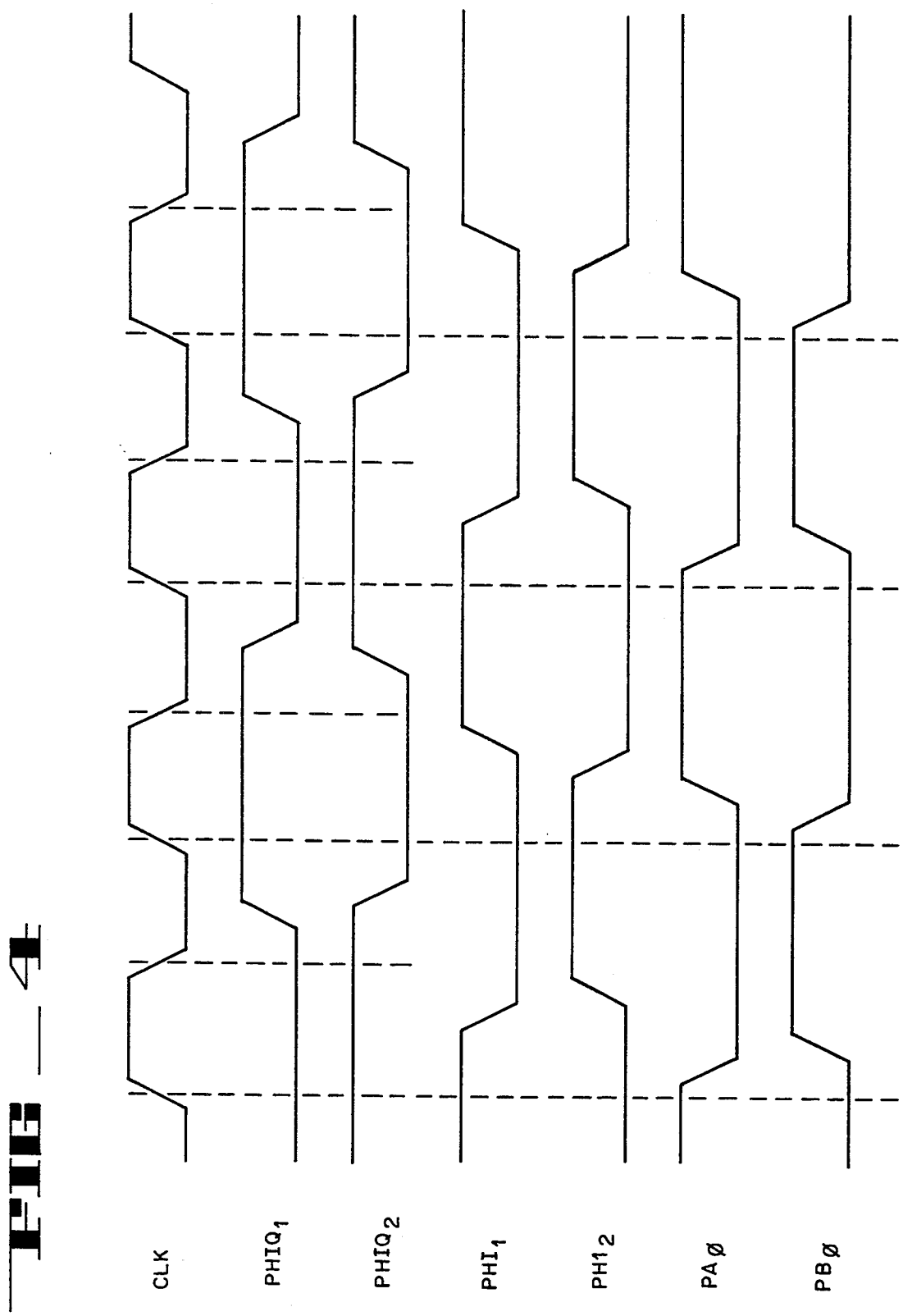
FIG_4

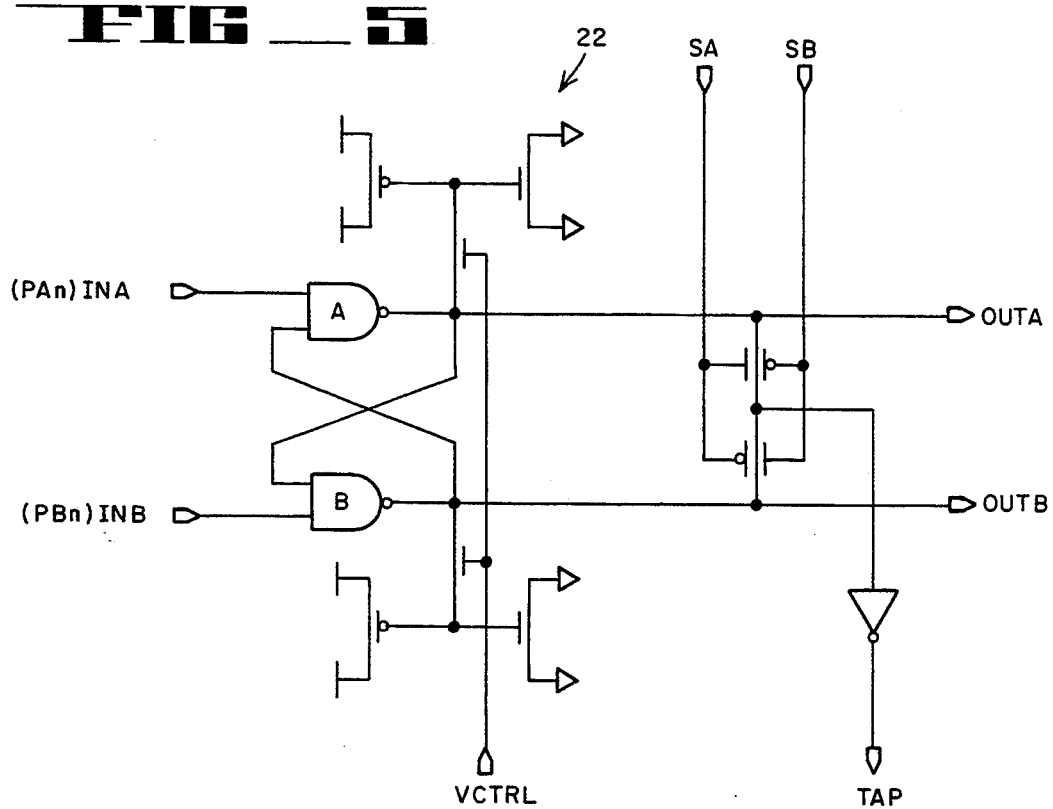
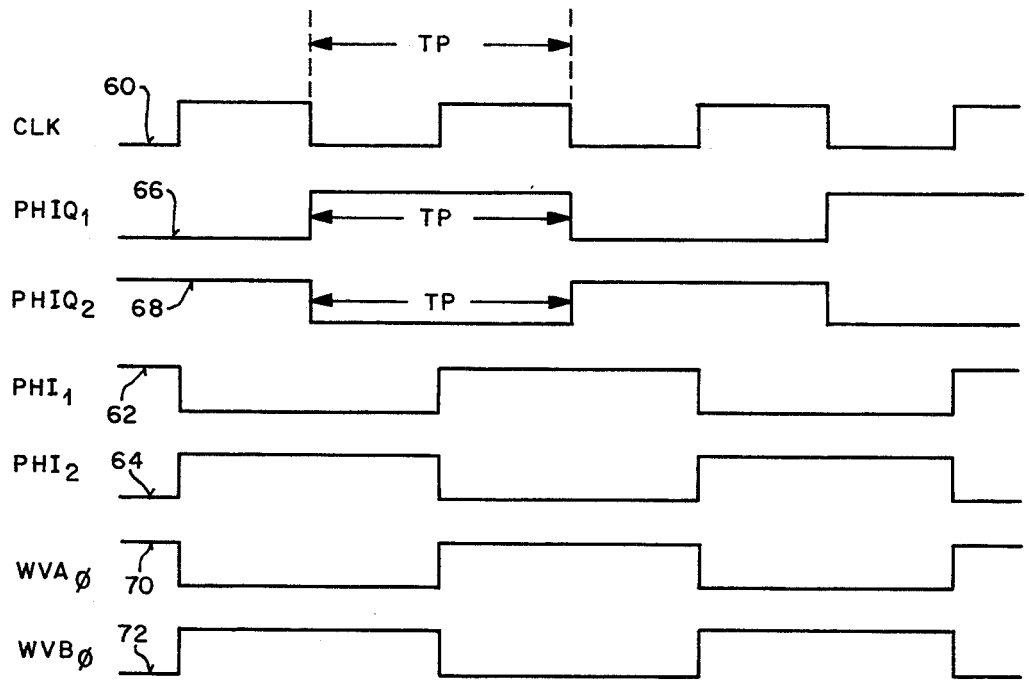

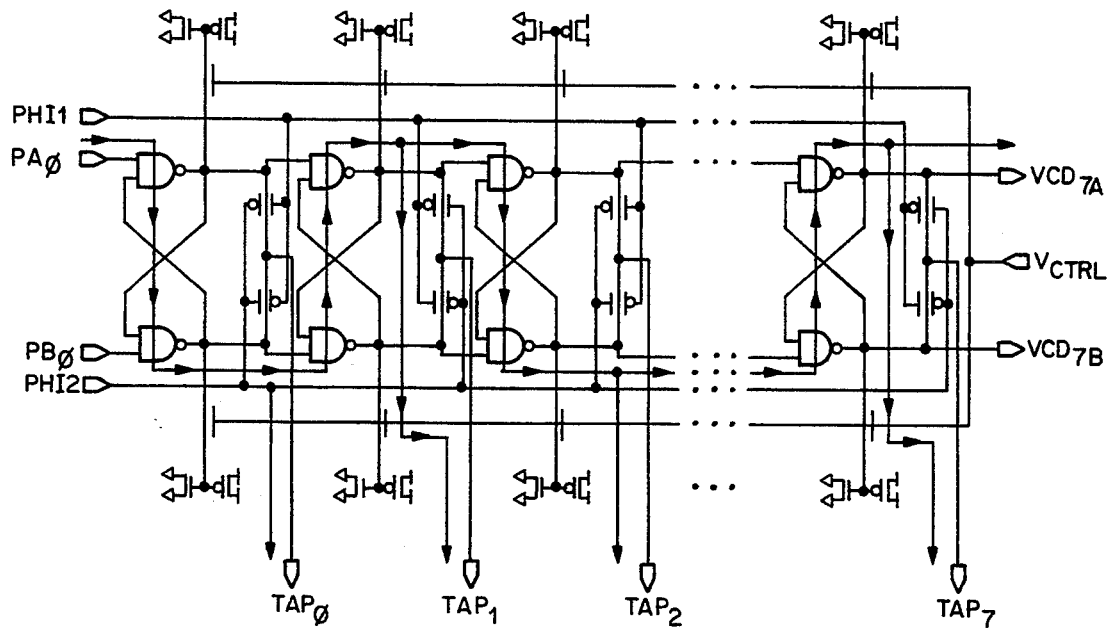
FIG_6
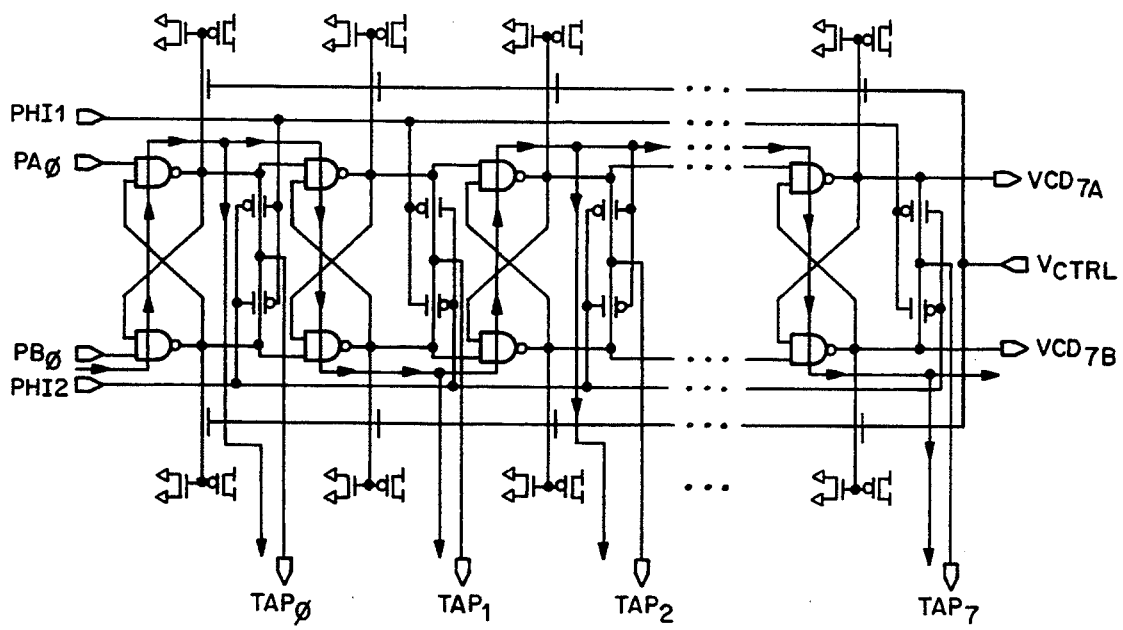
FIG_7

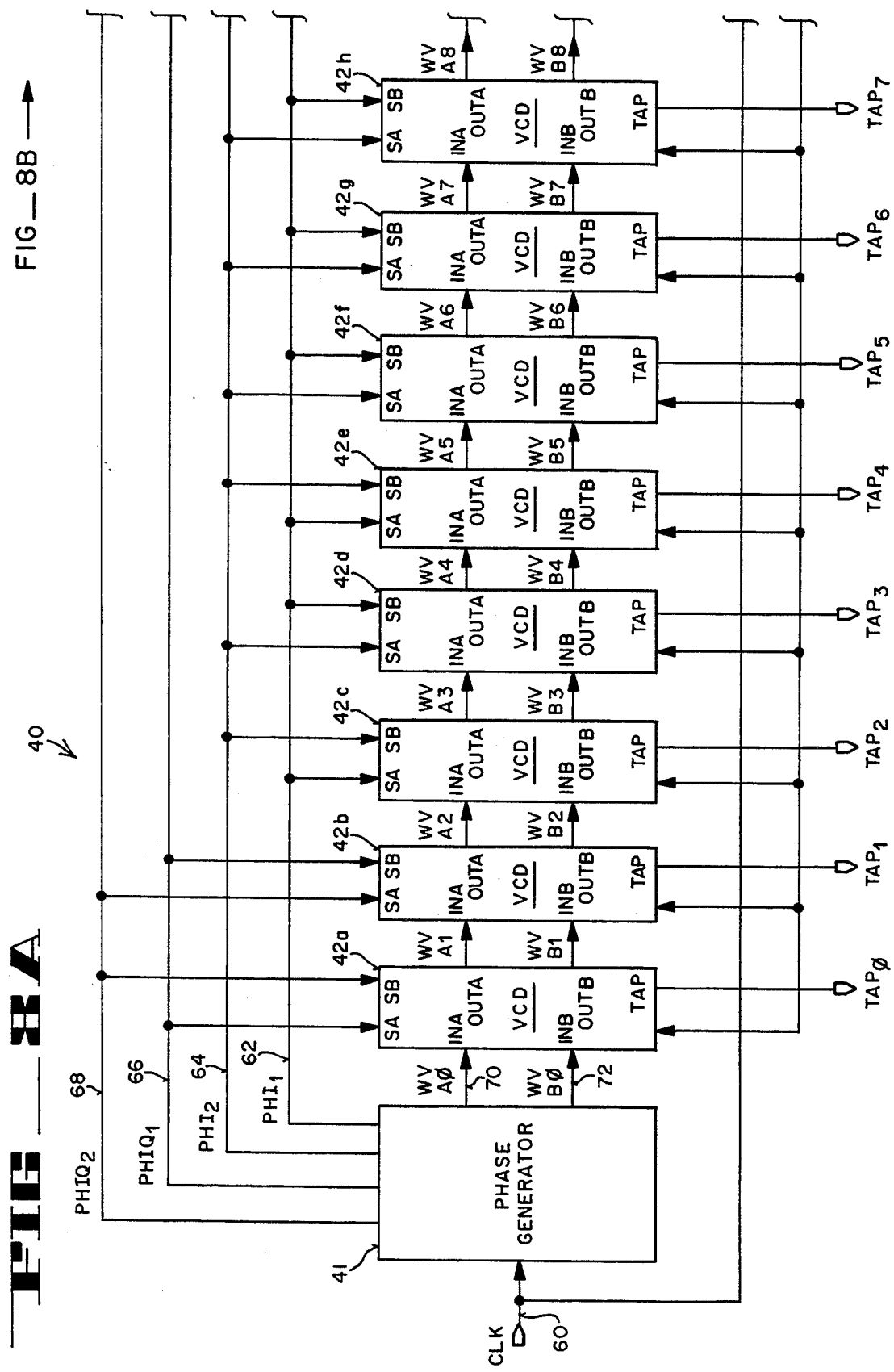

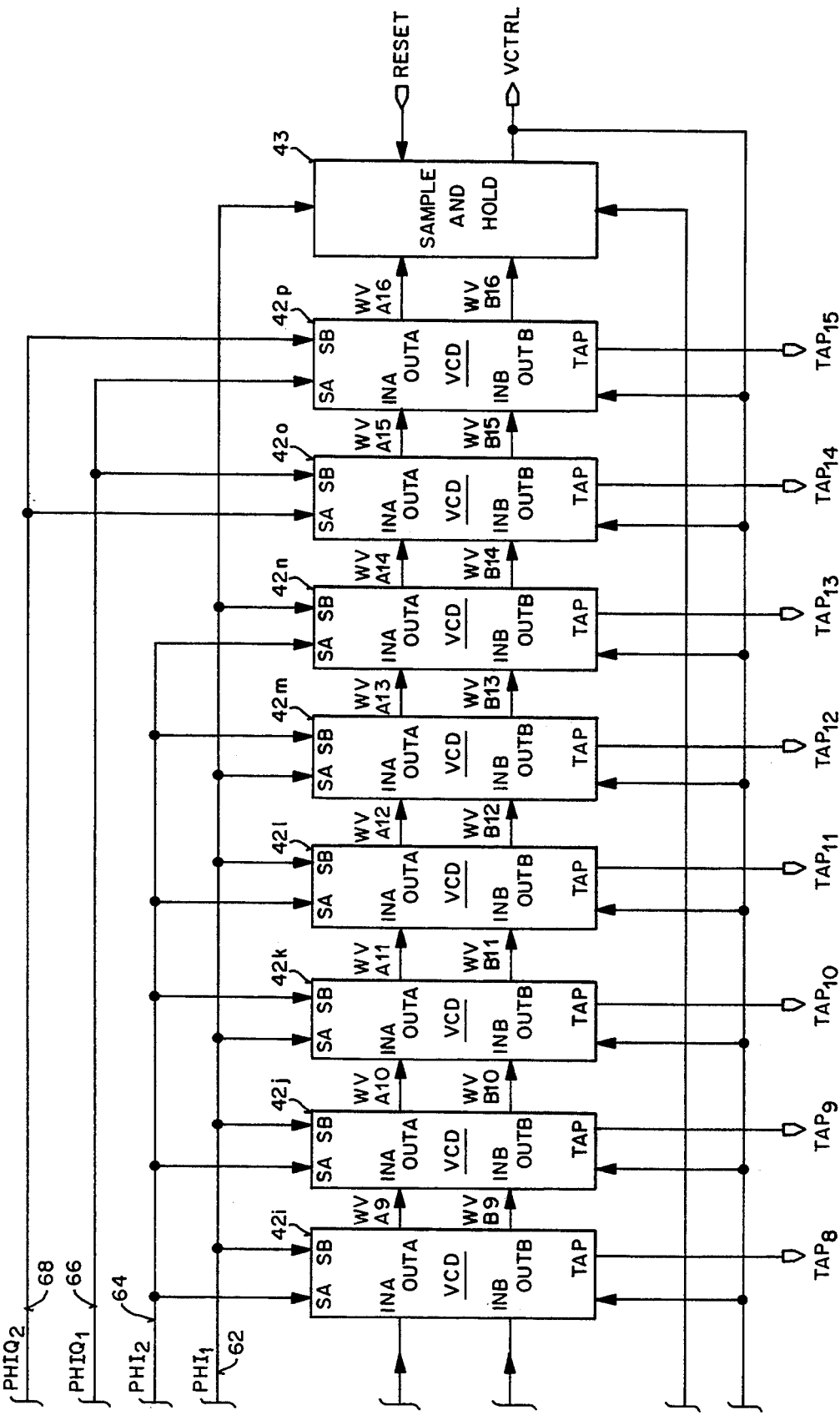

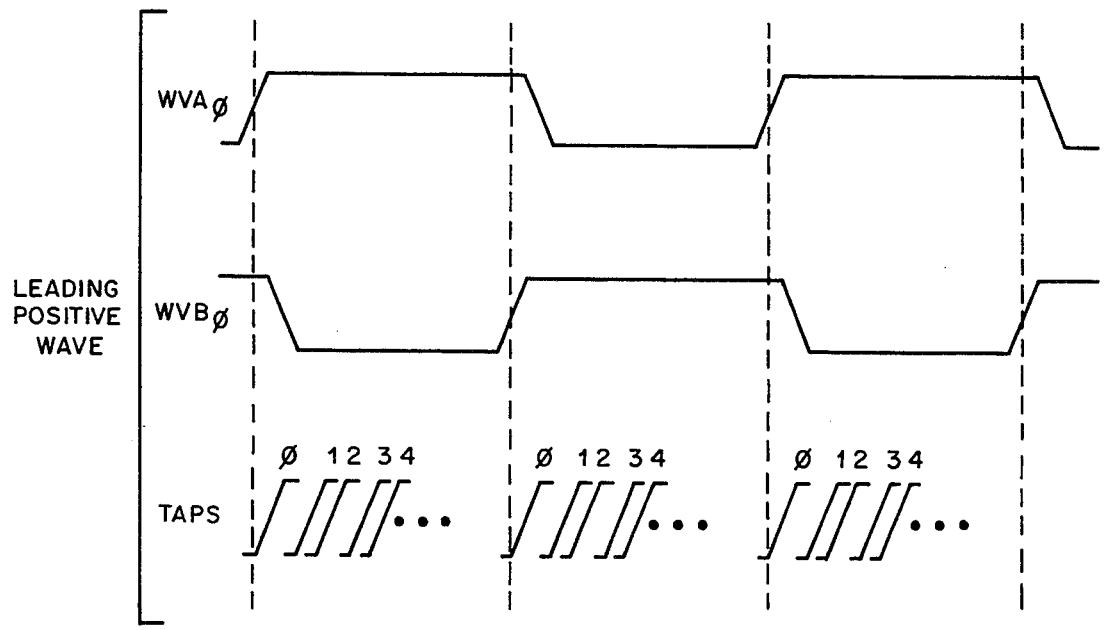
FIG_10A
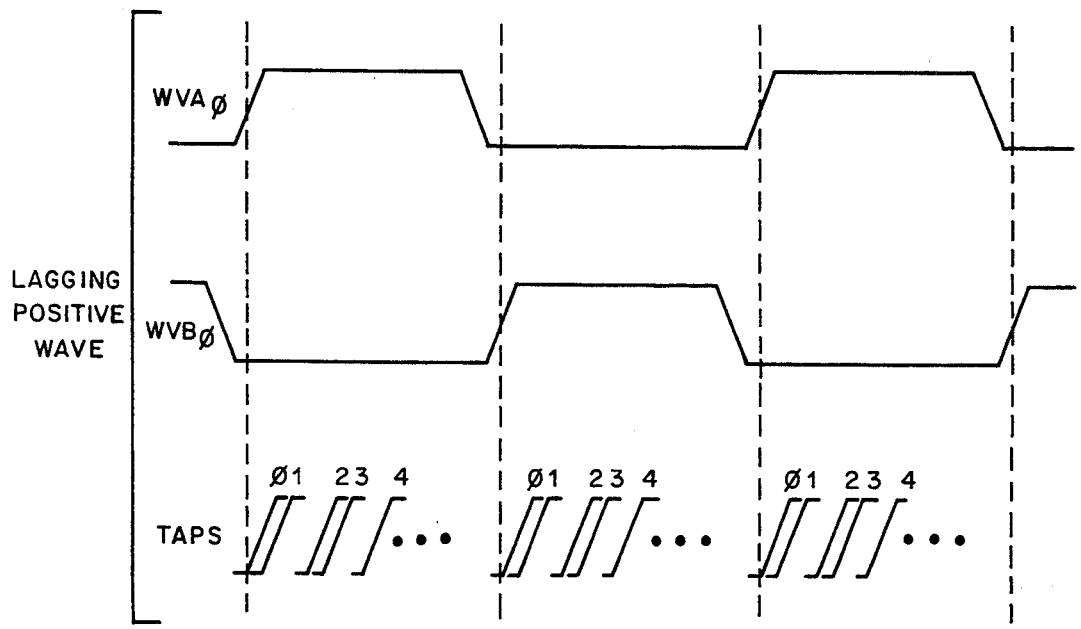
FIG_10B

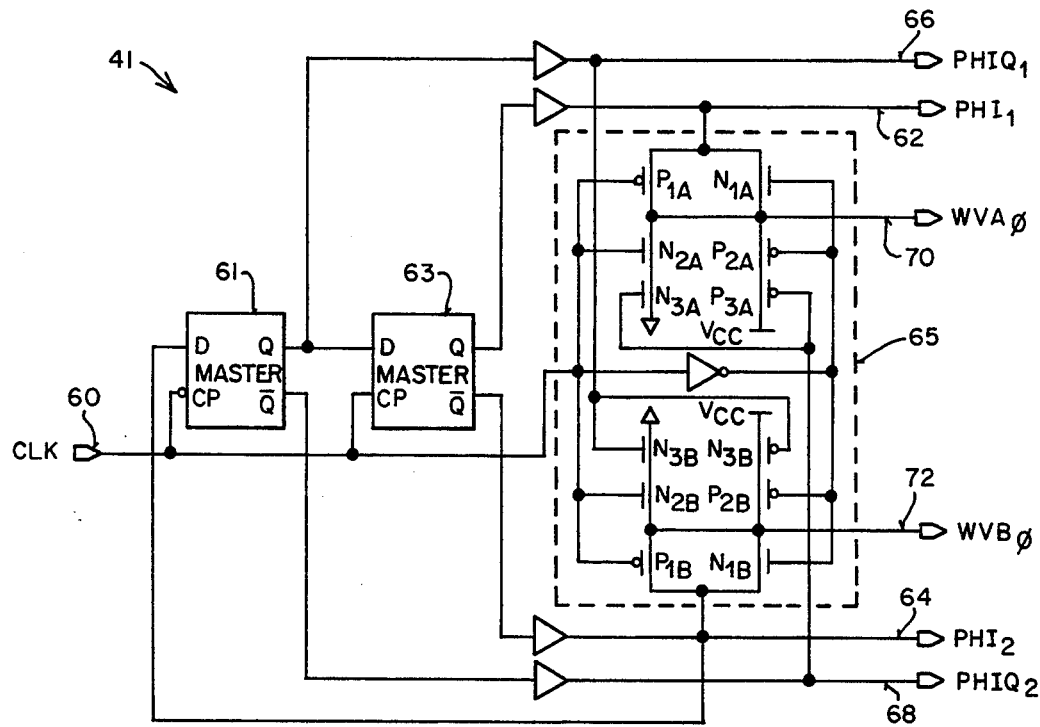
FIG_11
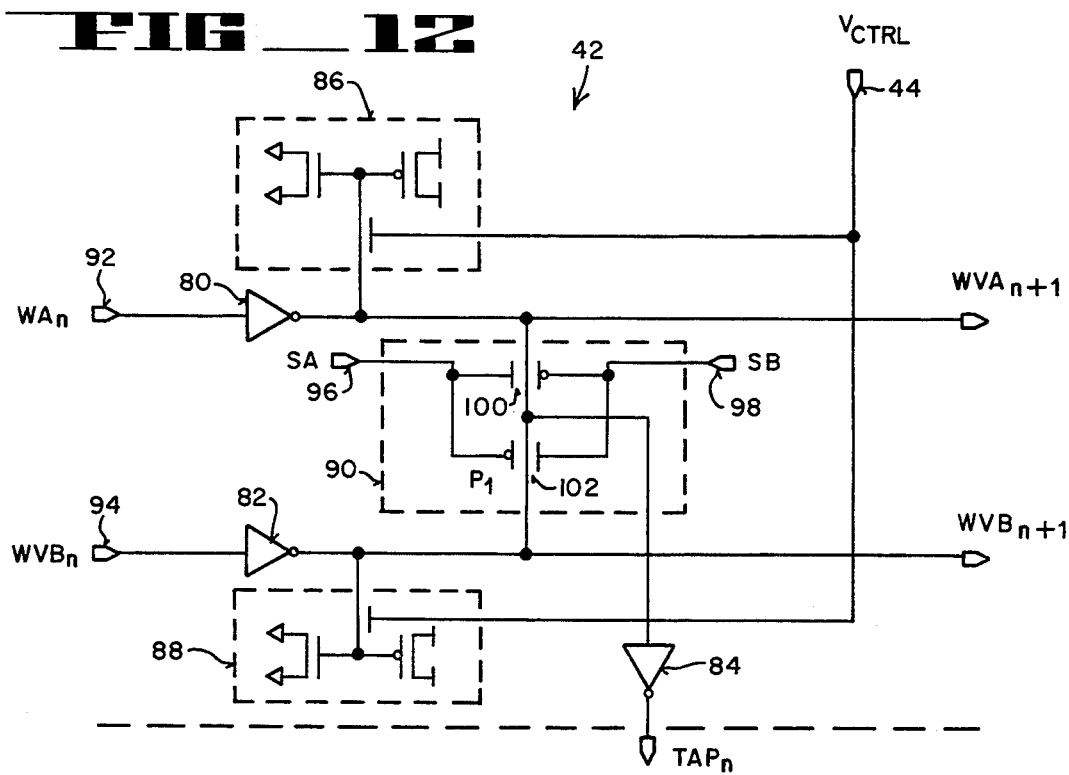
FIG_12

HIGH-RESOLUTION SYNCHRONOUS DELAY LINE

This is a continuation of application Ser. No. 07/778,005, filed Oct. 17, 1991, now abandoned.

FIELD OF THE INVENTION

The present invention relates to the generation of timing pulses having precise delays. More particularly, the present invention relates to a high resolution synchronous delay line for use in metal oxide-semiconductor (MOS) integrated circuits.

BACKGROUND OF THE INVENTION

Complementary metal oxide semiconductor (CMOS) integrated circuits often perform complex multistep operations having critical timing. A reference clock can provide at most two precision edges; e.g. the leading and trailing edges. Multistep operations that must be triggered at other points in the clock period therefore cannot use the reference clock as a trigger source.

The synchronous delay line (SDL)is a MOS circuit function which provides timing edges at precise, evenly-spaced intervals, and is insensitive to variations in processing, Vcc, or temperature. These timing edges enable the triggering of logic operations practically at any time with high resolution and precision.

A prior art synchronous delay line is shown in FIG. 1. This SDL was disclosed in U.S. Pat. No. 4,994,695, entitled "Synchronous Delay Line with Quadrature Clock Phases", which is assigned to the assignee of the present invention. SDL 20 is comprised of a phase generator 21, a plurality of series coupled voltage-controlled delay (VCD) stages 22, and a sample-and-hold circuit 23. SDL 20 includes 8 VCD stages, with each VCD stage 22 providing an output, or tap, of SDL 20.

FIG. 2 illustrates prior art phase generator 21, which includes a D-type master latch, a D-type slave latch, an edge-triggered D-type flip-flop, and several buffers. Phase generator 21 accepts the reference clock signal CLK and divides it by two to generate two pairs of complementary clock phases, $PHI_1/PHI_2$ and $PHIQ_1/PHIQ_2$. Two trigger signals $PA_0$ and $PB_0$ are also generated by the phase generator 21. $PA_0$ and $PB_0$ are also derived from the reference clock signal CLK and are complementary to each other. $PA_0$ and $PB_0$ are coupled to the first VCD stage 22 as trigger inputs. Although clock phases $PHI_1$ and $PHI_2$ could serve as trigger inputs, separate trigger inputs are generated due to the heavy capacitive loads that $PHI_1$ and $PHI_2$ typically drive.

The latches and flip-flops of FIG. 2 may be implemented in different ways, each one having advantages. FIG. 3A illustrates typical prior art latch that samples its D-input when CLK is low. FIG. 3B illustrates a typical prior art phase that samples its D-input when CLK is high. If the rising edge of CLK is used as the reference edge then the latch of FIG. 3A is used as the master latch and the latch of FIG. 3B is used as the slave latch in the circuit of FIG. 2. On the other hand, if the falling edge of CLK is designated as the reference edge then the roles of the latches of FIG. 3A and FIG. 3B are reversed.

FIG. 4 illustrates the waveforms generated by prior art phase generator 21 when using the latches of FIG. 3 and the rising edge of CLK as the reference. FIG. 4 reveals several characteristics of the prior art phase generator. First, $PHI_1$ is logically the same as $PA_0$; they both divide the frequency of CLK by two. Similarly, $PHI_2$ and $PB_0$ are logically identical to each other and are logical complements of $PHI_1$ and $PA_0$. Second, the rising edge of $PHIQ_1$ always leads the falling edge of $PHIQ_2$, just as the rising edge of $PHIQ_2$ always leads the falling edge of $PHIQ_1$. This characteristic arises from the latch of FIG. 3A, which serves as the master latch. In this circuit, $\overline{Q}$ can go low only after Q goes high, and conversely, Q can go low only after $\overline{Q}$ goes high. Third, the falling edge of $PHI_1$ always leads the rising edge of $PHI_2$, while the falling edge of $PHI_2$ always leads the rising edge of $PHI_1$. These same relationships hold for $PA_0$ and $PB_0$. The structure of the latch of FIG. 3B, which serves as the slave latch, gives rise to this characteristic. $\overline{Q}$ can go high only after Q goes low, and conversely, Q can go high only after $\overline{Q}$ goes low.

These characteristics cause an inherent skew between trigger signals $PA_0$ and $PB_0$ that cannot be eliminated.

The outputs of each VCD stage 22, designated as $PA_n$ and $PB_n$, are coupled as trigger inputs to subsequent stages.

A prior art VCD 22, or delay element 22, is shown in FIG. 5. The delay element 22 includes two cross-coupled NAND gates, A and B. Due to the design of delay element 22, only one of the complementary trigger inputs, $PA_0$ or $PB_0$, will propagate a signal, or wave, down SDL 20. The SDL 20 is triggered when either of the trigger inputs, $PA_0$ or $PB_0$, transitions from high to low. The route followed by the propagating wave is different in each clock phase. FIG. 6 indicates the route followed by the wave generated when $PA_0$ goes low and $PB_0$ goes high. FIG. 7 shows the route followed by the wave generated when $PA_0$ goes high and $PB_0$ goes low.

Clearly, only the low-going trigger input triggers propagation. The other trigger input, the high-going one, simply enables wave propagation. The timing skew between trigger inputs $PA_0$ and $PB_0$ is not critical: the enabling input may switch within a large window surrounding the switching of the triggering trigger input.

The delay between taps of SDL 20 is equal to the delay through the two gates, A and B, in each delay element 22. On alternate clocks, the propagation path of the wave through each delay element is reversed so that the delay through an arbitrary delay element is $t_{dh}(A)+t_{dl}(B)$ for one clock, and $t_{dl}(A)+t_{dh}(B)$ for the next clock, where $t_{dh}$ is the gate high-going delay time, and $t_{dl}$ is the gate low-going delay time. Because the gates are matched in all respects, including in layout, the delay through the gates on alternate clocks is identical. Consequently, the delay through the delay element 22 on alternate clocks is identical.

The delay control voltage $V_{CTRL}$ controls the delay time of each delay element 22 and, consequently, the SDL end-to-end delay. As $V_{CTRL}$ increases so does the SDL end-to-end delay. Through negative feedback, $V_{CTRL}$ stabilizes at a value which causes the SDL end-to-end delay to just equal the clock period TP. Thus, the higher the operating frequency, the lower the steady-state value of $V_{CTRL}$.

The resolution of SDL 20 is limited by the tap-to-tap delay $t_{del}$. The delay is given by $t_{del}=TP/N$, where N is the number of SDL taps. The number of taps is determined by the highest operating frequency of the integrated circuit in which the SDL is implemented. At the highest operating frequency $V_{CTRL}$ is approximately OV because the SDL operates at the highest frequency with minimum delay. Thus, the maximum number of SDL taps that can be implemented is determined by the SDL end-to-end delay at the maximum frequency. Because each delay element contributes one $t_{dh}$ and one $t_{dl}$ of delay, the maximum number of taps $N_{max}$ is given by $$N_{max} = TP_{min}/(t_{dh,min} + t_{dl,min})$$

where:

$TP_{min}$ is the clock period at the maximum frequency; and $t_{dh,min}$ and $t_{dl,min}$ are the minimum values of $t_{dh}$ and $t_{dl}$, respectively, which are obtained when $V_{CTRL}$ is approximately OV.

In other words, the maximum number of taps that can be implemented in a prior art SDL, which is synonymous with the maximum resolution obtainable from a prior art SDL, is limited by the fact that the delay contributed by each delay element is two gate delays. This is less than optimum resolution for certain high performance multi-step operations.

SUMMARY OF THE INVENTION

A synchronous delay line (SDL) for generating delayed signals synchronized with a clock signal is described. The present SDL includes a phase generator and a plurality of serially coupled voltage controlled delay elements. The phase generator takes the clock signal and generates a first trigger signal and a second trigger signal, which are substantially deskewed with respect to each other. Each of the delay elements receives two trigger inputs and outputs a delayed signal and two trigger outputs. The first and second trigger signals are coupled to one of the delay elements as trigger inputs. Each transition of the first trigger signal and second trigger signal causes the propagation of two waves through the SDL.

It is an object of the present invention to provide a high resolution, precision SDL.

It is another object of the present invention to provide an SDL with a tap-to-tap delay of no more than one gate delay.

Another object of the present invention is to provide a method of deskewing trigger signals generated by a phase generator.

Other objects, features, and advantages of the present invention will be apparent from the accompanying drawings and from the detailed description that follows below.

BRIEF DESCRIPTION OF DRAWINGS

The present invention is illustrated by way of example and not limitation in the figures of the accompanying drawings in which like references indicate similar elements and in which:

FIG. 1 is a block diagram of a prior synchronous delay line with quadrature clock phases;

FIG. 2 is a schematic diagram of a prior phase generator.

FIGS. 3A-3B are schematics of two prior latches.

FIG. 4 is a waveform diagram for a prior phase generator.

FIG. 5 is a schematic diagram of a prior delay element;

FIG. 6 is a diagram of the route followed in a prior voltage-controlled delay line when $PA_0$ goes low and $PB_0$ goes high;

FIG. 7 is a diagram of the route followed in a prior voltage-controlled delay line when $PA_0$ goes high and $PB_0$ goes low;

FIGS. 8A-8B are block diagrams of the present voltage-controlled delay line;

FIG. 9 is a timing diagram for the present phase generator clock signals;

FIGS. 10A-10B are timing diagrams illustrating two types of skews;

FIG. 11 is a schematic diagram of the present phase generator;

FIG. 12 is a schematic diagram of the present delay element.

DETAILED DESCRIPTION

As will be described in detail below, using the present voltage-controlled delay elements the present SDL provides double the number of taps and twice the resolution of prior SDLs given the same end-to-end delay. The present delay elements propagate two parallel waves through the present SDL. Eliminating the skew between the two parallel waves requires generating two deskewed trigger signals. Unlike prior art phase generators, the present phase generator may be adjusted to eliminate the skew between trigger signals.

FIGS. 8A-8B illustrate in block diagram form the high resolution synchronous voltage-controlled delay line 40 of the present invention.

SDL 40 includes phase generator 41, several serially coupled delay elements 42a-42p and sample-and-hold circuit 43. The number of taps available from SDL 40 is a function of the number of delay elements 42, which is a design choice.

Phase generator 41 receives reference clock signal CLK 60 as its input. Phase generator 41 divides the frequency of CLK 60 by two to generate two pairs of complementary clock phases, $PHI_1/PHI_2$ 62/64 and $PHIQ_1/PHIQ_2$ 66/68. Although phase generator 41 divides CLK 60 by two, the actual division factor is a matter of choice.

In-phase clock signals, $PHI_1$ 62 and $PHI_2$ 64, are complementary to each other and in-phase with reference clock signal CLK 60. In practice a slight time lag may exist between CLK 60 and $PHI_1/PHI_2$ 62/64, but such a lag is not critical to the present SDL. Quadrature clock phases $PHIQ_1$ 66 and $PHIQ_2$ 68 are complementary to each other and are shifted approximately 90° with respect to both CLK 60 and $PHI_1/PHI_2$ 62/64.

Phase generator 41 also outputs two complementary trigger signals, $WVA_0$ 70 and $WVB_0$ 72, which are also derived from CLK 60 and have a 50% duty cycle. $WVA_0$ 70 and $WVB_0$ 72 are applied as trigger inputs to the first delay element, delay element 42a. Although clock phases $PHI_1$ 62 and $PHI_2$ 64 could serve as the trigger inputs to delay element 42a, separate trigger inputs $WVA_0$ 70 and $WVB_0$ 72 are utilized because $PHI_1$ 62 and $PHI_2$ 64 are typically slowed down by the heavy capacitive loads they drive.

The various signals generated by phase generator 41 are shown schematically in FIG. 9. CLK 60 has a predetermined clock frequency; the clock period is designated as TP. Because of the divide-by-two operation of phase generator 41, each of the clock phases, $PHI_1$ 62 and $PHI_2$ 64, is high for a period TP and low for a period TP. $PHIQ_1$ 66 is a time-shifted version of $PHI_1$ 62. Similarly, $PHIQ_2$ 68 is a time-shifted version of $PHI_2$ 64. In the preferred embodiment, the time shift between PHI$_1$/PHI$_2$ 62/64 and PHIQ$_1$/PHIQ$_2$ 66/68 corresponds to approximately 90°.

As can be seen in FIGS. 8A–8B, phases PHI$_1$ 62 and PHI$_2$ 64 are coupled to interior delay elements 42c–42n and quadrature phases PHIQ$_1$ 66 and PHIQ$_2$ 68 are coupled to exterior delay elements 42a, 42b, 42o, 42p.

The number of delay elements connected to phase pair PHI$_1$/PHI$_2$ and to phase pair PHIQ$_1$/PHIQ$_2$ is, to a certain extent, flexible. The designer can choose how many delay elements to connect to each phase pair as long as the resulting high and low times of the output taps are solid. Usually, about ¼–½ the taps would be connected to PHIQ$_1$/PHIQ$_2$ 66/68 and about ¾–½ the taps to PHI$_1$/PHI$_2$ 62/64.

In response to trigger signals WVA$_0$70 and WVB$_0$72 two parallel waves, one positive and one negative, propagate through delay elements 42a–42p. Positive waves are triggered by one of the trigger signals WVA$_0$70 and WVB$_0$72 going high. Similarly, negative waves are triggered by one of the trigger signals 70 and 72 going low. In one clock cycle, WVA$_0$70 triggers a positive wave and WVB$_0$72 triggers a negative wave. In the next clock cycle WVA$_0$70 triggers a negative wave and WVB$_0$ triggers a positive wave. Positive waves provide outputs to even-numbered taps and negative waves provide outputs to odd-numbered taps.

Any skew between WVA$_0$ 70 and WVB$_0$ 72 causes the tap-to-tap delay of synchronous delay line 40 to be unequal. Two types of skew are possible. In one type of skew, high-going waves generated by WVA$_0$ or WVB$_0$ lead their associated low-going waves, generated by WVB$_0$ or WVA$_0$. This situation is illustrated in FIG. 10A. When high-going waves lead, even numbered tap outputs lead the odd numbered tap outputs. A second type of skew, illustrated in FIG. 10B occurs when the high-going waves generated by WVA$_0$ or WVB$_0$ lag their associated low-going waves, generated by WVB$_0$ or WVA$_0$. Lagging high-going waves cause the even numbered tap outputs to lag the odd-numbered tap outputs. Deskewing trigger signals WVA$_0$ 70 and WVB$_0$ 72 requires precise alignment of the high-going and low-going waves.

A schematic diagram of phase generator 41 is shown in FIG. 11. Unlike prior art phase generators, phase generator 41 may be adjusted to eliminate skew between trigger signals 70 and 72. Phase generator 41 includes two flip-flops 61 and 63, pass network 65 and a plurality of inverters.

Flip-flops 61 and 63 are D-type level-triggered flip-flops, which operate as master and slave flip-flops, respectively. Master flip-flop 61 generates PHIQ$_1$ 66, as well as the D input to flip-flop 63. The $\overline{Q}$ output of flip-flop 61 serves as PHIQ$_2$ 68. PHI$_1$ 62 is derived from the Q output of slave flip-flop 63, while PHI$_2$ 64 is derived from the $\overline{Q}$ output of flip-flop 63. Each of the Q and $\overline{Q}$ outputs from flip-flops 61 and 63 are buffered before being output as PHI$_1$/PHI$_2$ 62/64 and PHIQ$_1$/PHIQ$_2$ 66/68. PHI$_2$ 64 is coupled back as the D input to flip-flop 61.

Reference clock signal CLK 60 is coupled to the clock inputs of flip-flops 61, 63, and pass network 65. The outputs from master flip-flop 61 provide a nominal shift of 90° with respect to the outputs from slave flip-flop 63. The 90° shift occurs when the duty cycle of CLK 60 is at 50%. If the duty cycle of CLK 60 is not 50%, then the shift is either less than or more than 90° depending on the duty cycle. The actual amount of shift is not critical to the present SDL, as long as the shift provides for sufficient low and high times for the respective tap outputs.

Pass network 65 generates trigger signals WVA$_0$70 and WVB$_0$72. Pass network 65 allows trigger signals WVA$_0$70 and WVB$_0$72 to transition in opposite directions independently of each other. Both signals 70 and 72 transition when CLK 60 goes high. The direction in which WVA$_0$70 transitions depends upon PHIQ$_2$ 68, while the direction in which WVB$_0$72 transitions depends upon PHIQ$_1$ 66. As seen in FIG. 11, pass network 65 includes a number of transistors, which are also referred to as pass devices herein.

When CLK 60 goes low, pass devices P$_{1A}$ and N$_{1A}$ turn on connecting WVA$_0$70 to PHI$_1$ 62. Because pass devices N$_{2A}$ and P$_{2A}$ are turned off, WVA$_0$70 is disconnected from PHIQ$_2$ 68. Thus, WVA$_0$70 is unaffected by the transition of PHIQ$_2$ 68, which occurs when CLK 60 goes low. Similarly, WVB$_0$72 is connected to PHI$_2$ 64 while CLK 60 is low because pass devices P$_{1B}$ and N$_{1B}$ are on. Pass devices P$_{2B}$ and N$_{2B}$ are turned off, disconnecting WVB$_0$72 from PHIQ$_1$ 66.

WVA$_0$ 70 and WVB$_0$ 72 transition after PHIQ$_1$ 66 and PHIQ$_2$ 68 are stable and when CLK 60 goes high. When CLK 60 goes high, pass devices P$_{1A}$ and N$_{1A}$ turn off and devices P$_{2A}$ and N$_{2A}$ turn on. When this occurs, the state of WVA$_0$ 70 depends upon PHIQ$_2$ 68. If PHIQ$_2$ 68 is high, WVA$_0$ 70 is connected to ground via pass device N$_{3A}$. On the other hand, if PHIQ$_2$ 68 is low, WVA$_0$ 70 is connected to V$_{cc}$, approximately 2.5 volts to 5 volts, via P$_{3A}$.

Again, WVB$_0$ 72 operates analogously to WVA$_0$ 70. When CLK 60 goes high pass devices P$_{1B}$ and N$_{1B}$ turn off and pass devices N$_{2B}$ and P$_{2B}$ turn on. The state of WVB$_0$ 72 now depends on PHIQ$_1$ 66. If PHIQ$_1$ 66 is high, WVB$_0$ 72 is connected to ground via pass device N$_{3B}$. If PHIQ$_1$ 66 is low, WVB$_0$ 72 is connected to V$_{cc}$ via pass device P$_{3B}$.

Pass network 65 thus generates trigger signals 70 and 72 that are mutually independent. As a result, WVA$_0$ 70 and WVB$_0$ 72 can transition substantially simultaneously, thereby greatly reducing the skew between signals 70 and 72.

Any remaining skew between trigger signals 70 and 72 can be removed through proper selection of pass device sizes prior to fabrication. Because the rise and fall times of WVA$_0$ 70 and WVB$_0$ 72 are mutually independent, their rise and fall times may be adjusted independently. The rise time of WVA$_0$ 70 depends on the size of pass devices P$_{2A}$ and P$_{3A}$, which connect WVA$_0$ 70 to V$_{cc}$ when PHIQ$_2$ 68 is low and CLK 60 goes high. The size of pass devices N$_{2A}$ and N$_{3A}$ determine the fall time of WVA$_0$ 70 because they connect WVA$_0$ 70 to ground when PHIQ$_2$ 68 is high and CLK 60 goes high. The rise time of WVB$_0$ 72 is determined solely by the size of pass devices P$_{2B}$ and P$_{3B}$ because they connect WVB$_0$72 to V$_{cc}$ when PHIQ$_1$ 66 is low and CLK 60 goes high. Similarly, the size of pass devices N$_{2B}$ and N$_{3B}$ determine the fall time of WVB$_0$72 because they connect WVB$_0$ 72 to ground when CLK 60 goes high and PHIQ$_1$ 66 is high.

The independence of the rise and fall times of WVA$_0$ 70 and WVB$_0$ 72 allows relatively easy adjustments to eliminate skew between signals 70 and 72. For example, the rise time of WVA$_0$ 70 can be decreased with respect to its fall time by increasing the ratio of the sizes of pass devices P$_{2A}$ and P$_{3A}$ relative to the sizes of pass devices N$_{2A}$ and N$_{3A}$. We will define this ratio, which we shall call ratio A, as:

$$\text{ratio } A = \frac{\text{sin}(P_{2A}, P_{3A})}{\text{size}(N_{2A}, N_{3A})}$$

Similarly, the rise time of WVA$_0$ 70 relative to its fall time can be increased by decreasing ratio A. The rise and fall times of WVB$_0$ 72 can be adjusted by adjusting ratio B, which we denote as:

$$\text{ratio } B = \frac{\text{size}(P_{2B}, P_{3B})}{\text{size}(N_{2B}, N_{3B})}$$

The skew between WVA$_0$ 70 and WVB$_0$ 72 can be adjusted in simulations prior to fabrication by adjusting ratio A and ratio B until WVA$_0$ 70 and WVB$_0$ 72 are completely deskewed.

In FIG. 12 a schematic diagram of the present delay element 42 is shown. Delay element 42 includes three inverters, 80, 82, 84, two voltage-controlled capacitors, 86 and 88, and a pass network 90. Any device providing inversion, such as a NAND gate or a NOR gate, may be used in place of inverters 80 and 82; however, inverters are preferred because their delay is typically less than that of a NAND or NOR gate. Delay element 42 is implemented in complementary metal-oxide-semiconductor (CMOS) technology in the preferred embodiment; however, any of a number of MOS technologies could be used.

A pair of trigger inputs WVA$_n$ 92 and WVBA$_n$ 94 are coupled to inverters 80 and 82. In the case of the delay element 42a, WVA$_0$ 70 is input to inverter 80 and WVB$_0$ 72 is input to inverter 82. In each succeeding delay element the wave outputs from the previous stage are input as trigger inputs. Thus, WVA$_1$ and WVB$_1$ are input as trigger inputs to delay element 42b. The trigger outputs from each stage of SDL 40 are just inverted, time-delayed versions of the trigger inputs to that stage.

The delay through inverters 80 and 82, and thus the delay through delay element 42, is adjusted via voltage-controlled capacitors 86 and 88 and control voltage V$_{CTRL}$ 44. Capacitor 86 is coupled to the output of inverter 80 and capacitor 88 is similarly coupled to the output of inverter 82. The delay through each inverter 80 and 82 increases as its associated capacitance increases. The capacitance of capacitors 86 and 88 is varied by V$_{CTRL}$ 44; thus, V$_{CTRL}$ controls the end-to-end delay of SDL 40.

The control voltage V$_{CTRL}$ controls the delay of SDL 40 by causing the delay of inverters 80 and 82 to be long for inverter output voltages that are less than or equal to V$_{CTRL}$ minus V$_T$, where V$_T$ is the threshold voltage of the N-type transistors within the pass devices connected to V$_{CTRL}$. Alternatively, for output voltages from inverters 80 and 82 which are greater than V$_{CTRL}$ minus V$_T$, capacitors 86 and 88 are effectively disconnected from the outputs of inverters 80 and 82. By varying V$_{CTRL}$, the fraction of an inverter output transition during which the output is fully loaded down by the load capacitors 86 and 88 is varied.

The outputs of each inverter 80 and 82 are input to pass network 90, which includes two pass devices, or transistors, 100 and 102. Pass network 90 determines which inverter 80 or 82 output will be output to Tap$_n$ depending upon the state of the complementary clock phase signals. Pass network 90 receives two phasing signals, which are applied to inputs SA 96 and SB 98. Depending upon the location of a particular delay element either PHI$_1$ 62 and PHI$_2$ 64 or PHIQ$_1$ 66 and PHIQ$_2$ 68 are applied to SA 96 and SB 98. Preferably, PHI$_1$ 62 and PHI$_2$ 64 are input to the middle $\frac{1}{2}$-$\frac{3}{4}$ of delay elements 42 of synchronous delay line 40, while PHIQ$_1$ 66 and PHIQ$_2$ 68 are input to the remaining $\frac{1}{2}$-$\frac{1}{4}$ of delay elements 42 at the ends of synchronous delay 40.

Given delay elements 42, two waves propagate down SDL 40 every clock, each triggered by one of the trigger inputs WVA$_0$ 70 and WVB$_0$ 72. These waves follow the same path each clock cycle, with only their polarity inverted on alternate clocks.

As compared to prior art SDL 20, in SDL 40 each wave travels through half the number of gates. Thus, given the same end-to-end delay, SDL 40 provides more than double the number of taps and more than twice the resolution as prior SDL 20. The number of taps is more than doubled because the delay of an inverter is typically less than that of a NAND gate.

Because SDL 40 relies upon two waves propagating in parallel, as opposed to a single wave as in the prior SDL 20, it is important that the two waves be precisely aligned. Precise alignment for waves WVA$_{0-(N-1)}$ and WVB$_{0-(N-1)}$ is guaranteed by designing phase generator 41 to eliminate any skew between WVA$_0$ and WVB$_0$, as previously discussed.

Sample-and-hold circuit 43 will not be described in detail. In substantially the same manner as prior art sample-and-holds, sample-and-hold circuit 43 generates a control voltage V$_{CTRL}$ that forces the end-to-end delay T$_D$ of SDL 40 to equal the clock period TP. Negative feedback is used by sample-and-hold circuit 43 to generate the appropriate value for V$_{CTRL}$.

Thus, a high resolution synchronous delay line has been described. The SDL includes voltage controlled delay elements that propagate two parallel waves and a phase generator which generates deskewed trigger signals.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. An integrated circuit synchronous delay line for generating delayed signals synchronized with a clock signal, comprising:

a) a phase generator coupled to said clock signal generating a first phasing signal approximately 90° out of phase with said clock signal and a second phasing signal substantially in phase with said clock signal, said phase generator generating a first trigger signal WVA$_0$ and a second trigger signal WVB$_0$, said first trigger signal WVA$_0$ and said second trigger signal WVB$_0$ being substantially deskewed with respect to each other, said first trigger signal WVA$_0$ being complementary to said second trigger signal WVB$_0$, said first and second trigger signals WVA$_0$ and WVB$_0$ being substantially in phase with said clock signal, said phase generator further comprising:

i) a master latch receiving said clock signal and outputting said first phasing signal;

ii) a slave latch receiving said first phasing signal and said clock signal and outputting said second phasing signal; and iii) a first pass network generating said first trigger signal $WVA_0$ and said second trigger signal $WVB_0$, said first pass network being coupled to said clock signal, said first phasing signal and said second phasing signal; and b) a plurality of serially coupled voltage controlled delay elements, each delay element having two trigger inputs, a delayed signal tap output, two trigger outputs, and a clock input, the plurality of serially coupled voltage controlled delay elements including a multiplicity of even voltage controlled delay elements and odd delay elements, a first of the even voltage controlled delay elements having its trigger inputs coupled to the first trigger signal $WVA_0$ and the second trigger signal $WVB_0$, each of the remaining even delay elements having its trigger inputs coupled to the trigger outputs of an adjacent odd delay element, all of the odd delay elements having their trigger inputs coupled to trigger outputs of an adjacent even delay element, some of the plurality of serially coupled voltage controlled delay elements having their clock inputs coupled to the first phasing signal and others of the plurality of serially coupled voltage controlled delay elements having their clock inputs coupled to the second phasing signal, wherein during a first clock cycle of said clock signal a first transition by the first trigger signal $WVA_0$ from a low voltage level to a high voltage level triggers transistions of the delayed signal tap outputs of the even voltage controlled delay elements, and a second transition by the second trigger signal $WVB_0$ from the high voltage to the low voltage triggers transistions of the delayed signal tap outputs of the odd controlled delay elements, and wherein during a second clock cycle following said first clock cycle a third transition by the first trigger signal $WVA_0$ from the high voltage level to the low voltage level triggers transitions of the delayed signal tap outputs of the odd voltage controlled delay elements and a fourth transition by the second trigger signal $WVB_0$ from the low voltage level to the high voltage level triggers transitions of the delayed signal tap outputs of the even voltage controlled delay elements.

2. The integrated circuit synchronous delay line of claim 1 wherein said each of said plurality of voltage controlled delay elements comprises:

a) a first inverting means for inverting one of said trigger inputs and outputting one of said trigger outputs;

b) a second inverting means for inverting the other of said trigger inputs and outputting the other of said trigger outputs; and c) a second pass network coupled to said trigger outputs, said second pass network outputting one of said trigger outputs as said delayed signal tap output.

3. The integrated circuit synchronous delay line of claim 2 wherein said first inverting means and said second inverting means comprise inverters.

4. The integrated circuit synchronous delay line of claim 2 wherein each of said delay elements further comprises a device for controlling a delay between said clock signal and said delayed signal tap output, said device for controlling a duration of said delay being coupled to said trigger outputs, said delay varying in response to a control voltage.

5. The integrated circuit synchronous delay line of claim 4 wherein said device for controlling a delay comprises:

a) a first voltage controlled capacitive device having capacitance coupled to one of said trigger outputs, the capacitance of said first voltage controlled capacitive device carrying in response to said control voltage; and b) a second voltage controlled capacitive device coupled to the other of said trigger outputs, the capacitance of said second voltage controlled capacitive device varying in response to said control voltage.

6. The integrated circuit synchronous delay line of claim 5 further comprising a control signal generator for generating said control voltage.

7. The integrated circuit synchronous delay line of claim 6 wherein said control signal generator comprises a sample and hold circuit.

8. The integrated circuit synchronous delay line of claim 1 wherein said first pass network comprises:

a) a first multiplicity of transistors coupled to said clock signal, said second phasing signal and said master latch, said first multiplicity of transistors generating said first trigger signal $WVA_0$; and b) a second multiplicity of transistors coupled to said clock signal, said first phasing signal and said slave latch, said second multiplicity of transistors generating said second trigger signal $WVB_0$.

9. The integrated circuit synchronous delay line of claim 8 wherein said first multiplicity of transistors comprises:

a) a first P-type transistor coupled to said second phasing signal, said clock signal and said first trigger signal $WVA_0$;

b) a first N-type transistor coupled to said second phasing signal, said clock signal and said first trigger signal $WVA_0$;

c) a second N-type transistor coupled to said clock signal and said first trigger signal $WVA_0$;

d) a third N-type transistor coupled to said master latch, a first voltage level, and said second N-type transistor;

e) a second P-type transistor coupled to said clock signal and said first trigger signal $WVA_0$; and f) a third P-type transistor coupled to a second voltage level, said master latch and said second P-type transistor.

10. The integrated circuit synchronous delay line of claim 8 wherein said second multiplicity of transistors comprises:

a) a first P-type transistor coupled to said slave latch, said clock signal and said second trigger signal $WVB_0$;

b) a first N-type transistor coupled to said slave latch, said clock signal and said second trigger signal $WVB_0$;

c) a second N-type transistor coupled to said clock signal and said second trigger signal $WVB_0$;

d) a third N-type transistor coupled to said first phasing signal, a first voltage level, and said second N-type transistor;

e) a second P-type transistor coupled to said clock signal and said second trigger signal $WVB_0$; and f) a third P-type transistor coupled to a second voltage level, said first phasing signal and said second P-type transistor.

11. The integrated circuit synchronous delay line of claim 2 wherein each second pass network within an even voltage controlled delay element during said first clock cycle couples to said delayed signal tap output one of the two trigger outputs that is triggered by the first transition of the first trigger signal $WVA_0$ from the low voltage level to the high voltage level, and wherein during the second clock cycle the second pass network couples to the delayed signal tap output one of the two trigger outputs that is triggered by the fourth transition of the second trigger signal $WVB_0$ from the low voltage to the high voltage.

12. The integrated circuit synchronous delay line of claim 11 wherein each second pass network within an odd voltage controlled delay element during the first clock couples to said delayed signal tap output one of said two trigger outputs that is triggered by the second trigger signal from the high voltage level to the low voltage level and wherein during the second clock cycle said second pass network couples to said delayed signal output one of said two trigger outputs that is triggered by the third transition by the first trigger signal $WVA_0$ from the high voltage level to the low voltage level.

13. The integrated circuit synchronous delay line of claim 12 wherein each second pass networks within an even voltage controlled delay element couples to said delayed signal tap output during the first clock signal one of said two trigger outputs of said even delay element that is triggered by the first transition by the first trigger signal $WVA_0$ from the low voltage level to the high voltage level and wherein during the second clock cycle the second pass network couples to said delayed signal tap output one of said two trigger outputs of said even delay element that is triggered by the fourth transition of the second trigger signal $WVB_0$ from the low voltage to the high voltage.

14. The integrated circuit synchronous delay line of claim 13 wherein each of the second pass networks within an odd voltage controlled delay element during said first clock cycle couples to said delayed signal tap output one of said two trigger outputs of said odd delay element that is triggered by the second transition by the second trigger signal from the high voltage level to the low voltage level and wherein during said second clock cycle said second pass network couples to said delayed signal tap output one of said two trigger outputs of said odd delay element that is triggered by the third transition by the first trigger signal $WVA_0$ from the high voltage level to the low voltage level.

15. An integrated circuit synchronous delay line for generating delayed signals synchronized with a clock signal, comprising:

a) a phase generator coupled to said clock signal and generating a first phasing signal approximately 90° out of phase with said clock signal and a second phasing signal substantially in phase with said clock signal, said phase generator generating a first trigger signal $WVA_0$ and a second trigger signal $WVB_0$, said first trigger signal $WVA_0$ and said trigger signal $WVB_0$ being substantially deskewed with respect to each other, said first trigger signal $WVA_0$ being complementary to said second trigger signal $WVB_0$, said first and second trigger signals $WVA_0$ and $WVB_0$ being substantially in phase with said clock signal, said phase generator further comprising:

i) a mater latch receiving said clock signal and outputting said first phasing signal;
ii) a slave latch receiving said first phasing signal and said clock signal and outputting said second phasing signal; and
iii) a first pass network generating said first trigger signal $WVA_0$ and said second trigger signal $WVB_0$, said first pass network being coupled to said clock signal, said first phasing signal and said second phasing signal; and b) a plurality of serially coupled voltage controlled delay elements, each voltage controlled delay element having two trigger inputs, a delayed signal tap output, two trigger outputs and a clock input, said plurality of serially coupled voltage controlled delay elements including a multiplicity of even voltage controlled delay elements and odd voltage controlled delay elements, a first of the even voltage controlled delay elements having its trigger inputs coupled to the first trigger signal $WVA_0$ and the second trigger signal $WVB_0$, and each of the remaining even delay elements having its trigger inputs coupled to the trigger outputs of an adjacent odd delay element, and all of the odd delay elements having their trigger inputs coupled to trigger outputs of an adjacent even delay element, some of the plurality of serially coupled voltage controlled delay elements having their clock inputs coupled to the first phasing signal and others of the plurality of serially coupled voltage controlled delay elements having their clock inputs coupled to the second phasing signal, wherein during a first clock cycle of said clock signal a first transition by the first trigger signal $WVA_0$ from a low voltage level to a high voltage level triggers transitions of the delayed signal tap outputs of the even voltage controlled delay elements and a second transition by the second trigger signal $WVB_0$ from the high voltage to the low voltage triggers transitions of the delayed signal tap outputs of the odd voltage controlled delay elements, and wherein during a second clock cycle following said first clock cycle a third transition by the first trigger signal $WVA_0$ from the high voltage level to the low voltage level triggers transitions of the delayed signal tap outputs of the odd voltage controlled delay elements and a fourth transition by the second trigger signal $WVB_0$ from the low voltage level to the high voltage level triggers transitions of the delayed signal tap outputs of the even voltage controlled delay elements.

16. The integrated circuit synchronous delay line of claim 15 wherein said first pass network comprises:

a) a first multiplicity of transistors coupled to said clock signal, said second phasing signal and said master latch, said first multiplicity of transistors generating said first trigger signal $WVA_0$; and
b) a second multiplicity of transistors coupled to said clock signal, said first phasing signal and said slave latch, said second multiplicity of transistors generating said second trigger signal $WVB_0$.

17. The integrated circuit synchronous delay line of claim 16 wherein the first multiplicity of transistors comprises:

a) a first P-type transistor coupled to said second phasing signal, said clock signal and said first trigger signal $WVA_0$;

b) a first N-type transistor coupled to said second phasing signal, said clock signal and said first trigger signal $WVA_0$;

c) a second N-type transistor coupled to said clock signal and said first trigger signal $WVA_0$;

d) a third N-type transistor coupled to said master latch, a first voltage level, and said second N-type transistor;

e) a second P-type transistor coupled to said clock signal and said first trigger signal $WVA_0$; and f) a third P-type transistor coupled to a second voltage level, said master latch and said second P-type transistor.

18. The integrated circuit synchronous delay line of claim 15 wherein each of said voltage controlled delay elements comprise:

a) a first inverting means for inverting one of said trigger inputs and outputting one of said trigger outputs;

b) a second inverting means for inverting the other of said trigger inputs and outputting the other of said trigger outputs; and c) a second pass network coupled to said trigger outputs, said second pass network outputting one of said trigger outputs as said delayed signal tap output.

19. The integrated circuit synchronous delay line of claim 18 wherein each of said voltage controlled elements further comprise a device for controlling a delay between said clock signal and sad delayed signal tap output, said device being coupled to said trigger outputs, said delay varying in response to a control voltage.

20. The integrated circuit synchronous delay line of claim 19 wherein the device for controlling a delay comprises:

a) a first voltage controlled capacitive device having capacitance coupled to one of said trigger outputs, the capacitance of said first voltage controlled capacitive device varying in response to said controlled voltage; and b) a second voltage controlled capacitive device coupled to the other of said trigger outputs, the capacitance of said second voltage controlled capacitive device varying in response to said control voltage.

21. The integrated circuit synchronous delay line of claim 20 further comprising a control signal generator for generating said control voltage.

22. The integrated circuit synchronous delay line of claim 21 wherein said control signal generator comprises a sample and hold circuit coupled to trigger outputs from one of said delay elements.

23. An integrated circuit synchronous delay line for generating delayed signals synchronized with a clock signal, comprising:

a) a phase generator coupled to the clock signal generating a first phasing signal approximately 90° out of phase with said clock signal and a second phasing signal substantially in phase with said clock signal, said phase generator generating a first trigger signal and a second trigger signal, the first trigger signal and the second trigger signal being deskewed with respect to each other, the first trigger signal being complementary to the second trigger signal, said first and second trigger signals $WVA_0$ and $WVB_0$ being substantially in phase with said clock signal, phase generator further comprising:

i) a master latch receiving the clock signal and outputting the first phasing signal;

ii) a slave latch receiving the first phasing signal and the clock signal and outputting the second phasing signal; and iii) a first pass network generating the first trigger signal and the second trigger signal, the first pass network being coupled to the clock signal, the first phasing signal and the second phasing signal; and b) a plurality of serially coupled voltage controlled delay elements, each delay element having two trigger inputs, a delayed signal output, two trigger outputs, and a clock input, the plurality of serially coupled voltage controlled delay elements including a first multiplicity of voltage controlled delay elements and a second multiplicity of voltage controlled delay elements, one of the first multiplicity of voltage controlled delay elements having its trigger inputs coupled to the first trigger signal and the second trigger signal, all other delay elements of the first multiplicity of voltage controlled delay elements having their trigger inputs coupled to the trigger outputs of an adjacent one the second multiplicity of voltage controlled delay elements, all of the second multiplicity of voltage controlled delay elements having their trigger inputs coupled to trigger outputs of an adjacent one of the first multiplicity of voltage controlled delay elements, some of the plurality of serially coupled voltage controlled delay elements having their clock inputs coupled to the first phasing signal and others of the plurality of serially coupled voltage controlled delay elements having their clock inputs coupled to the second phasing signal, wherein during a first clock cycle of the clock signal a first transition by the first trigger signal from a low voltage level to a high voltage level triggers transitions of the delayed signal outputs of the first multiplicity of voltage controlled delay elements, and a second transition by the second trigger signal from the high voltage level to the low voltage level triggers transitions of the delayed signal outputs of the second multiplicity of voltage controlled delay elements, and wherein during a second clock cycle following said first clock cycle a third transition by the first trigger signal from the high voltage level to the low voltage level triggers transitions of the delayed signal outputs of the second multiplicity of voltage controlled delay elements, and a fourth transition by the second trigger signal from the low voltage level to the high voltage level triggers transitions of the delayed signal outputs of the first multiplicity of voltage controlled delay elements.

24. The integrated circuit synchronous delay line of claim 23 wherein each of the plurality of voltage controlled delay elements comprises:

a) a first inverting means for inverting one of the trigger inputs and outputting one of the trigger outputs;

b) a second inverting means for inverting the other of the trigger inputs and outputting the other of the trigger outputs; and c) a first pass network coupled to the trigger outputs, the second pass network outputting one of said trigger outputs as the delayed signal output.

25. The integrated circuit synchronous delay line of claim 23 wherein each of the plurality of voltage controlled delay elements further comprises a device for controlling a duration of a delay between the clock signal and the delayed signal output, the device for controlling a duration of a delay being coupled to the trigger outputs, the duration of the delay varying in response to a control voltage.

26. The integrated circuit synchronous delay line of claim 23 wherein the first pass network comprises:
   a) a first multiplicity of transistors coupled to the clock signal, the second phasing signal and the master latch, the first multiplicity of transistors generating the first trigger signal; and
   b) a second multiplicity of transistors coupled to the clock signal, the first phasing signal and the slave latch, the second multiplicity of transistors generating the second trigger signal.

27. The integrated circuit synchronous delay line of claim 26 wherein the first multiplicity of transistors comprises:
   a) a first P-type transistor coupled to the second phasing signal, the clock signal and the first trigger signal;
   b) a first N-type transistor coupled to the second phasing signal, said clock signal and the first trigger signal;
   c) a second N-type transistor coupled to the clock signal and the first trigger signal;
   d) a third N-type transistor coupled to the master latch, a first voltage level, and the second N-type transistor;
   e) a second P-type transistor coupled to the clock signal and the first trigger signal; and
   f) a third P-type transistor coupled to a second voltage level, the master latch and the second P-type transistor.

28. The integrated circuit synchronous delay line of claim 23 wherein the second multiplicity of transistors comprises:
   a) a first P-type transistor coupled to the slave latch, the clock signal and the second trigger signal;
   b) a first N-type transistor coupled to the slave latch, the clock signal and the second trigger signal;
   c) a second N-type transistor coupled to the clock signal and the second trigger signal;
   d) a third N-type transistor coupled to the first phasing signal, a first voltage level, and the second N-type transistor;
   e) a second P-type transistor coupled to the clock signal and said second trigger signal; and
   f) a third P-type transistor coupled to a second voltage level, the first phasing signal and the second P-type transistor.

* * * * *